(12) United States Patent
Ayala et al.

(10) Patent No.: US 8,819,918 B2
(45) Date of Patent: Sep. 2, 2014

(54) MANUFACTURING METHOD FOR A DUAL INTERFACE CARD

(75) Inventors: Stéphane Ayala, Palézieux Gare (CH); Lionel Carre, Seeg (DE); Jari-Pascal Curty, Nyon (CH)

(73) Assignee: Assa Abloy AB (SE)

( * ) Notice: Subject to any disclaimer, the term of this patent is extended or adjusted under 35 U.S.C. 154(b) by 1033 days.

(21) Appl. No.: 12/193,941

(22) Filed: Aug. 19, 2008

(65) Prior Publication Data
US 2009/0151150 A1  Jun. 18, 2009

(30) Foreign Application Priority Data
Sep. 5, 2007 (EP) ..................................... 07115733

(51) Int. Cl.
*H01Q 13/00* (2006.01)
(52) U.S. Cl.
USPC ............................. 29/600; 29/592.1; 235/492
(58) Field of Classification Search
USPC ..................... 29/600, 830–832, 25.41–25.42;
343/853; 235/492, 486–488
See application file for complete search history.

(56) References Cited

U.S. PATENT DOCUMENTS

| | | | |
|---|---|---|---|
| 4,897,534 A | 1/1990 | Haghiri-Tehrani | |
| 5,598,032 A | 1/1997 | Fidalgo | |
| 5,671,525 A * | 9/1997 | Fidalgo | ........................... 29/600 |
| 6,467,692 B1 * | 10/2002 | Tarantino et al. | ............. 235/492 |
| 6,677,186 B1 | 1/2004 | Zafrany et al. | |
| 6,881,605 B2 * | 4/2005 | Lee et al. | ....................... 438/106 |
| 6,910,636 B2 * | 6/2005 | Kim et al. | ....................... 235/492 |
| 6,957,481 B1 | 10/2005 | Patrice | |
| 7,154,758 B2 * | 12/2006 | Welling et al. | ................. 361/764 |
| 7,444,737 B2 * | 11/2008 | Worl | .............................. 29/601 |
| 7,958,622 B1 * | 6/2011 | Ayala et al. | ..................... 29/600 |
| 8,091,208 B2 * | 1/2012 | Finn | ................................ 29/600 |
| 2004/0155114 A1 * | 8/2004 | Rietzler | ........................ 235/492 |
| 2006/0163367 A1 | 7/2006 | Choi et al. | |

FOREIGN PATENT DOCUMENTS

| | | | |
|---|---|---|---|
| DE | 19500925 | * | 7/1996 |
| DE | 19941637 | | 3/2001 |
| EP | 0706152 | | 4/1996 |
| EP | 0671705 | | 9/1996 |
| WO | WO0025265 | | 5/2000 |
| WO | WO2007065404 | | 6/2007 |

OTHER PUBLICATIONS

Written Opinion, EPA Form 1703 12.07CSX, cf Form 1507, Application No. 07115733.3, pp. 1-5.
Meister, European Search Report, Application No. 07115733, The Hague, Feb. 1, 2008, pp. 1-2.

* cited by examiner

*Primary Examiner* — Minh Trinh
(74) *Attorney, Agent, or Firm* — Sheridan Ross P.C.

(57) ABSTRACT

A method of manufacturing a chip card, such as a dual interface card, is provided. The method generally includes collocating multiple card support sheets one onto the other, depositing a conductive adhesive onto contact pads on at least one of the sheets, positioning a dual interface module in a recess established in at least one of the sheets, and executing a lamination step.

11 Claims, 6 Drawing Sheets

MANUFACTURING METHOD FOR A DUAL INTERFACE CARD

TECHNICAL FIELD

The present invention concerns a manufacturing method for cards with a dual interface module showing free contact electrodes at the surface of the card for a contact-type communication, and pads connected to an antenna embedded in the card body for a contactless-type communication. These cards are called dual interface cards.

The present invention also concerns a card obtained by the method steps of the invention.

BACKGROUND ART

Such dual interface cards (contact/contactless) are known in the prior art. In the field of fabricating such cards, it has been usual to laminate several layers of material forming a card with an antenna (for example a wire antenna) embedded in the card body for the contactless communication.

Once a card element has been prepared, it is necessary to create a recess in the card element, usually by milling, in order to form the space in which a chip module is to be inserted and to free the contact portions of the antenna which is embedded, said contact portions being connected to contact pads of the chip module once said module has been inserted in the recess.

In general all these operations are done in two milling steps. The first one uses a milling tool with a large diameter to go fast and form a "standard" contact cavity.

The second one uses a smaller milling tool to make two small holes in order to reach the antenna pads.

Accordingly, these two steps can be done on a given piece of equipment only if it includes two milling stations Milling steps are however not practical and have many drawbacks. For example, they induce internal mechanical stress in the laminated layers which may end in defects, delamination, deformation of the card etc.

Technically, the milling is very difficult to carry out in order to avoid misalignment or damaging the contact portion of the antenna for example.

Hence, due to these milling steps, such cards are produced only one by one which is expensive and time consuming.

Once the milling operation has been done, the chip module is inserted in the recess. Generally thermo glue is added (in the recess or on the back of the module) in order to achieve the attachment of the module to the laminated layers. The module is then shortly subjected to high temperature and pressure, typically one second at 180° C., in order to be fixed definitively in the recess. The insertion of a chip module in a laminated card is a weak point in that the chip module is only held by gluing and may detach itself from the card, for example when the card is bent.

In this process, the electrical connection of the contact pads of the module to the antenna is generally achieved by depositing a conductive glue on the contact portions of the antenna and configured such as that once the module is fixed in the recess, the pads of the module are also embedded in the conductive glue. The problem is that the short temperature increase (one second at 180° C.) carried out to fix the module in the recess is not long enough to fully cure the conductive glue, and as such is not sufficient to create a stable and optimal electrical connection between the module and the antenna. Accordingly, the finished cards are traditionally submitted to an extensive additional curing step in an oven, for example at 50° C. for 48 hours, that is extremely time consuming.

There are some publications in the state of the art showing how to manufacture dual interface cards without the milling step. Each of the disclosed methods has its drawbacks.

Publication US 2006/0163367, the entire contents of which are hereby incorporated herein by reference, discloses a dual interface smart card having an improved structure. This publication recognizes the problems of conventional fabrication processes using the milling step indicated above and only indicates that the chip module ("COB") is connected with the antenna, then that the antenna or the sheet layer provided with the antenna and at least one intermediate layer and/or a printed layer are piled up before the lamination process, the card body and COB being integrated as one body using a lamination process. In particular, in the process described, the COB is mounted and connected to the antenna first, then a communication test is carried out, and then only an adhesive can be applied. Preferably in this publication, the antenna contact portion has only one line to minimize the overlap portion between the antenna terminal and the COB.

Another publication mentioning the problems of alignment and connection between antenna and chip module is WO 00/25265, the entire contents of which are hereby incorporated herein by reference. However, in this document, an alternative way of creating the recess is disclosed. The first way consists in laminating the different layers together and then forming the recess in the laminated layer. Typically, this can be done by milling and this process corresponds exactly to the one described above as being the prior art.

The second way is firstly to punch holes in the layers and then to laminate the layers together hence forming the recess by alignment of the punched holes. Once the recess has been created either by milling or by lamination of punched layers, then the chip module can be inserted in the recess. It is fixed in the recess by an electrically conductive adhesive film, said film being also used to realize the contact between the chip module and the antenna.

A further prior art is document DE 199 41 637, the entire contents of which are hereby incorporated herein by reference. In this publication, the idea is to avoid the additional step of providing an electrically conductive glue before inserting the chip module in the recess. According to the idea disclosed, a printed antenna is made of a conductive paste that is still soft when the module is placed in the recess, in order to allow a better penetration of the contact pads of the module in the material of the antenna. Then one applies heat punctually in order to activate the conductive paste.

EP 0 671 705, the entire contents of which are hereby incorporated herein by reference, relates to a process for making a dual-interface card. In this process, to create the recess, one overmolds the layer supporting the antenna with another layer, except at the place where the antenna contacts are situated in order to allow the contact with the chip module. By using this process, there is then no need to use a specific milling step as described above.

U.S. Pat. No. 4,897,534, the entire contents of which are hereby incorporated herein by reference, shows another method for producing a data carrier having an integrated circuit (IC). In this device, there is no connection to an antenna. In addition, in the process the various layers forming the card including the substrate bearing the IC a pressed together using heat and pressure. Hence, this prior art is not concerned with the connection of a chip module in the recess of a card and the creation of said recess.

U.S. Pat. No. 6,677,186, the entire contents of which are hereby incorporated herein by reference, discloses a method for making an electronic device in particular a contactless card. Firstly a chip is placed in a recess which is larger than the size of the chip. A hot lamination is applied in order to melt material from the recess and embed the side of the chip. Then, a layer carrying a printed antenna is applied with the contact pads of the antenna contacting the contact pads of the chip. A second hot lamination is applied in order to fix the sheets together and to allow the pads of the chip to penetrate in the (soft) material of the printed antenna pads. In one variation, the step of insulating the sides of the chip and the step of connecting the chip to the antenna are performed during a single lamination. This method is not disclosed for dual interface or contact cards, and only for (printed) antenna made of soft material.

U.S. Pat. No. 6,957,481, the entire contents of which are hereby incorporated herein by reference, discloses a method for making contactless cards with a chip and is directed mainly to the connection of the chip to the antenna. In the process disclosed metallized protrusions are produced on two contact pads on the chip and the connection of the chip to the antenna is effected by embedding the metallized protrusions in the thickness of the antenna, at the time that the chip is attached to said antenna.

WO 2007/065404, the entire contents of which are hereby incorporated herein by reference, further discloses a dual interface chip card and process for making said chip card. In this prior art, in order to avoid a milling step, the described fabrication process needs two lamination steps, a first one after contacting the pads of the antenna with the pads of the chip module after which step the direct contact side of the chip protrudes from the laminated layers. Then a second lamination process is carried out in order to add the layers so that the chip is flush with the surface of the card.

SUMMARY OF THE INVENTION

It is an aim of the present invention to improve the process of making chip cards, in particular dual interface chip cards.

It is a further aim of the present invention to provide a process that is simple to carry out, reliable and which produces cards of good quality, in particular by avoiding the use of a milling step Additionally, the process allows production of cards in format that increases the manufacture yield.

According to at least some embodiments of the present invention, the method to produce a dual interface card, comprises at least the following steps:
- pre-punching of holes for the module in different laminate layers,
- producing the antenna by embedding wire (preferably with meanders to form the antenna contact pads),
- assembling the different laminate layers together, forming the recess for the module,
- dispensing 2 dots of conductive glue on the antenna contact pads,
- positioning the module in the recess,
- carrying out a single lamination step to finish the card and connecting the module and the antenna whereby the conductive glue curing occurs during lamination.

The advantage of the method according to at least some embodiments of the invention is that the card is finished in a single production step. No milling is necessary any more. Both bonds of the module to the card material (PVC) and the antenna are more reliable than in the traditional milling approach, in particular with higher durability in case of bending of the card.

The internal mechanical stresses or defaults due to the milling process are not present.

No additional curing in an oven is necessary (for example at 50° C. during 48 hours) for curing the glue.

Further, there is no additional material to be added to maintain the chip in the laminated card as taught in the prior art.

DETAILED DESCRIPTION

Figure 1:
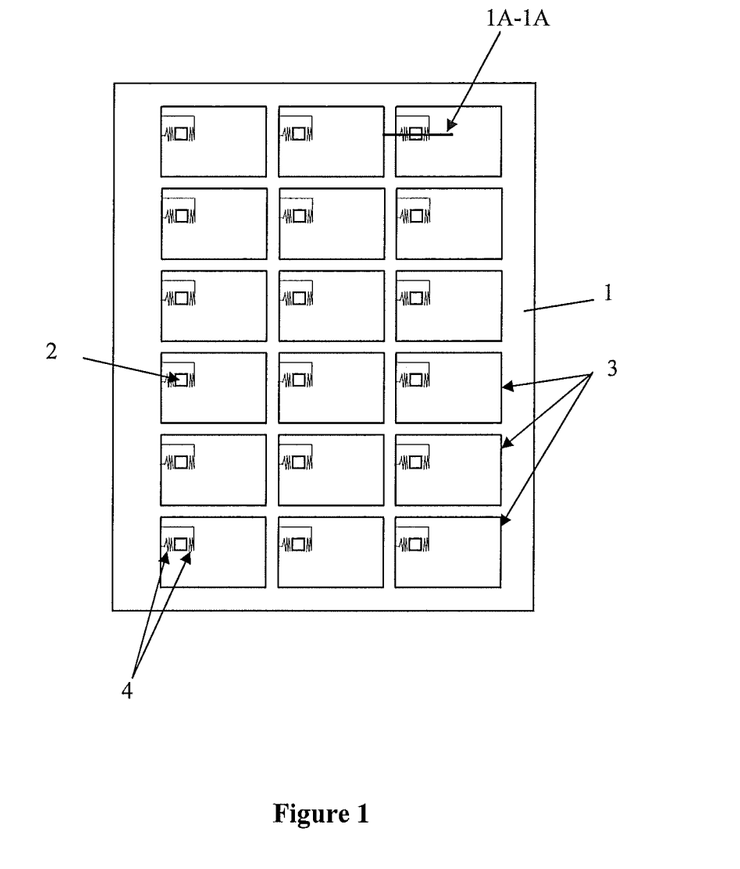
FIG. 1 shows a top view of a layer of material used to make cards according to embodiments of the invention in a first step.

FIG. 1 shows an initial step of the process. A sheet or layer of material 1 is punched according to the top size of the module (described in more detail further down in the present specification) to form openings 2 in the layer 1. Typically, said sheet 1 comprises several openings 2 punched in a matrix like arrangement of lines and columns in order to be able to fabricate several cards at the same time with the same piece. Once the cards have been built, the sheets will be cut into individual cards.

The thickness of this sheet 1 will be higher than the thickness of the glob top protection associated with the module.

This material can be PVC, PC, or any other common plastic used in the smart card industry. As said, this sheet, also called format, will support several dual interface card locations in a matrix-like arrangement.

Figure 1A:
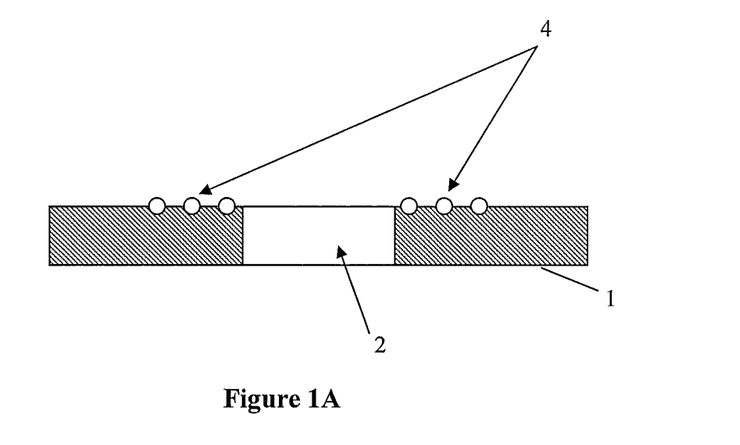
FIG. 1A shows a partial cross section across line 1A-1A of FIG. 1.

FIG. 1A shows a partial cross section of the opening 2. This cross-section corresponds for example to the opening that is placed on the top right hand side of the sheet represented in FIG. 1.

An antenna 3 is made on this same material sheet 1. This antenna may be created by any known technology used in the art. In the example represented, the technology used is preferably wire embedding.

Connection pads 4 of the dual interface antenna 3 are placed at the right position to match with the chip module contact pads. For example, these contact pads 4 are made by meanders (i.e., multiple bends) of the wire forming the antenna. One possibility is to use directly a non isolated (for example silver coated) wire to create the embedded antenna.

An alternative is to use an insulated wire for the embedding process (allowing direct bridge manufacture), and then removing (with a brush tool for example) the insulation from the meanders extremities of the wire (the parts of the wire forming the contact pads of the antenna). Of course, other equivalent constructions are also possible in the present invention as long as the antenna comprises solid metallic contact pads being adapted to receive the conductive glue that will allow an electrical contact between the antenna and the chip module contact pads.

Figure 2:
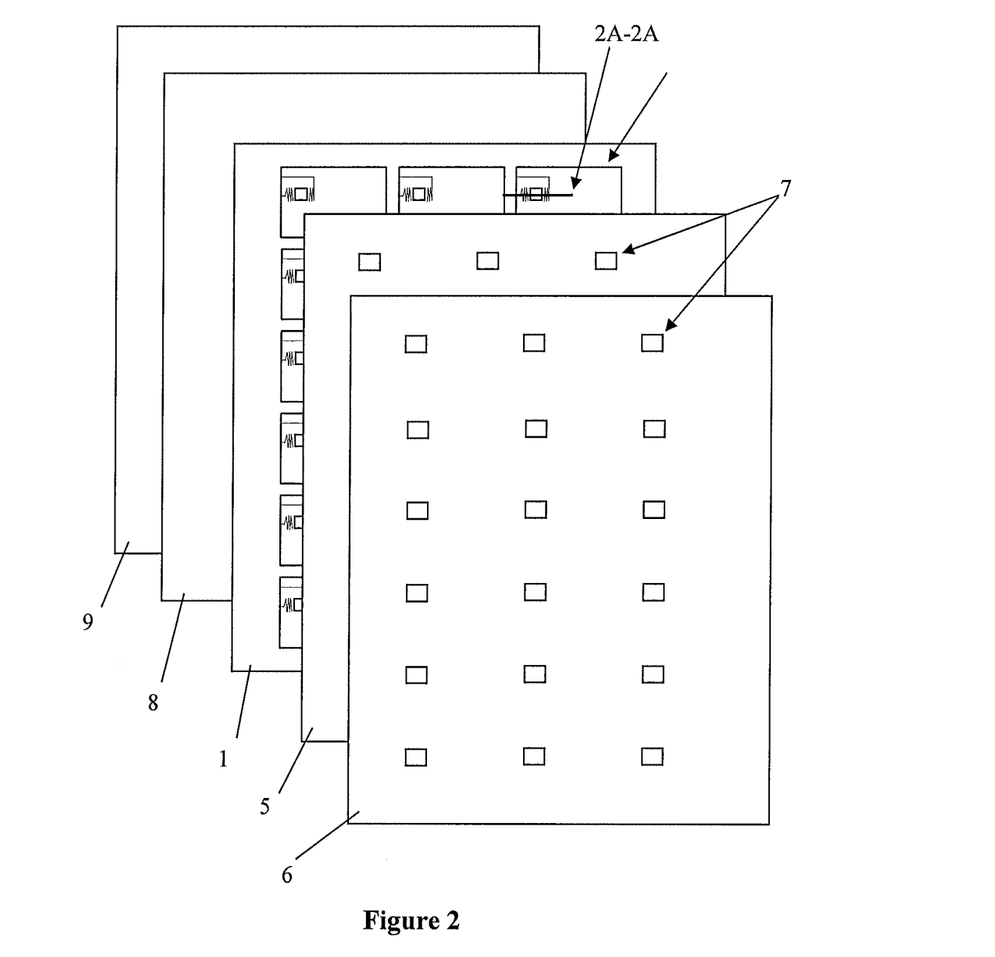
FIG. 2 shows a top view of a layer of material used to make cards according to embodiments of the invention in a second step.

In FIG. 2, four different other sheets or layers are collocated to form the final structure of the card. Such layers could be printed or not (sheets 8 and 5), such other layers could be overlay (sheets 6 and 9), or any combination of different layers to match with the end lamination process used. For example, on the FIG. 2, the structure could be for example:

Sheet 9: transparent overlay 50 um
Sheet 8: printed PVC sheet 150 um
Sheet 1: White PVC sheet 400 um with high frequency antenna on
Sheet 5: Printed PVC sheet 150 um
Sheet 6: transparent overlay 50 um The sheets 5 and 6 are punched to form openings 7 according the size of the lead frame of the module, and are then collocated over the sheet 1. In a similar way, two other sheets 8 and 9 are co-located under the sheet 1. These two sheets will be of the same format as the others but without any punched holes. The thickness of all the sheets 1,5,6,8 and 9 is chosen such as to get the final ISO card thickness once all the sheets have been laminated together. Of course, the number of sheets is not limited and more (or less) sheets may be collocated, as long as the final card thickness is respected.

Figure 2A:
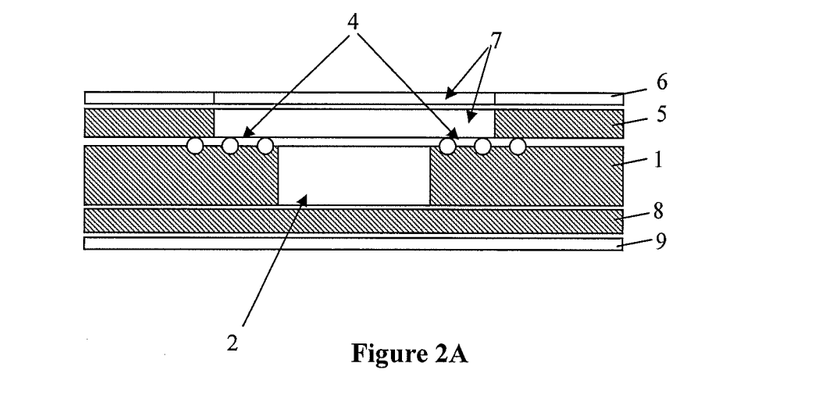
FIG. 2A shows a partial cross section across line 2A-2A of FIG. 2.

In FIG. 2A, a partial cross section of these sheets is illustrated showing the different layers with different opening sizes or absence of openings 8 (sheets 8 and 9). Indeed, as one can understand, the opening sizes in layers 5, 6 and 1 are not the same and openings 7 in layers 5, 6 are larger to free the contact pads 4 of the antenna 3. For example, this cross-section corresponds to the position that is placed on the top right hand side of the sheets 1, 5, 6, 8, 9 represented in FIG. 2.

For the sake of simplicity, in the following description, the assembly of sheets/layers 1, 5, 6, 8, 9 will be referred to as body 12, and the cavity formed by openings 2 and 7 as recess 13.

Figure 3:
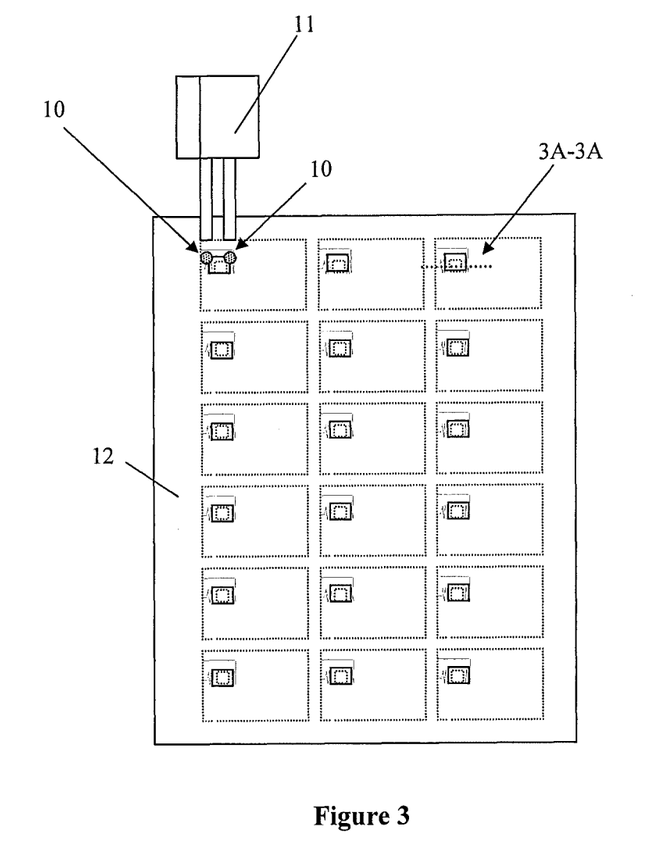
FIG. 3 shows a top view of a layer of material used to make cards according to embodiments of the invention in a third step.

In FIG. 3, two dots 10 of conductive glue or paste are deposited by an appropriate glue deposition means 11 on the two connection pads 4 of the antenna 3 for each antenna 3 located in the body 12.

Figure 3A:
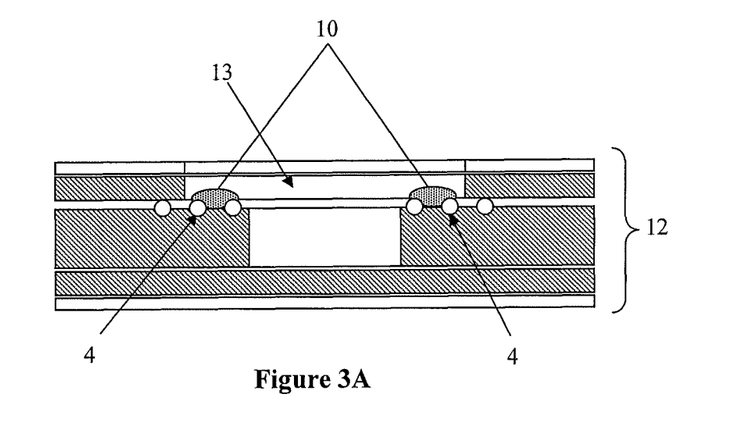
FIG. 3A shows a partial cross section across line 3A-3A of FIG. 3.

FIG. 3A shows a partial cross section the body 12 with the dots of glue 10 deposited on the antenna contact pads 4. The body 12 further comprising the recess 13 (as defined above). For example, this cross-section corresponds to the position that is placed on the top right hand side of the structure of FIG. 3.

Typical glues used in the present invention should be a thermosetting conductive adhesive (or as named in the art ICA: Isotropic Conductive Adhesive) and are the following (or equivalents):

epoxy based mono-component with 80% of silver particles, for example as sold under the trade name "Elecolit® 3653" of the company Panacol Elosol. Polymerization: 10 min @ 120° C.
alternatively
two component conductive adhesive as sold under the trade name "EPO-TEK® H20E" of the company Epoxy Technology. Polymerisation: 15 min @ 120° C.

Of course, other equivalent glues might be considered. However, the conductive glue chosen must have polymerization (curing) parameters as similar as possible with the lamination parameter that will be applied in the final step. In particular the lamination temperature can be equal or slightly higher than the polymerization temperature of the glue. Instead of isotropic conductive glues, one can also choose anisotropic conductive glues.

Figure 4:
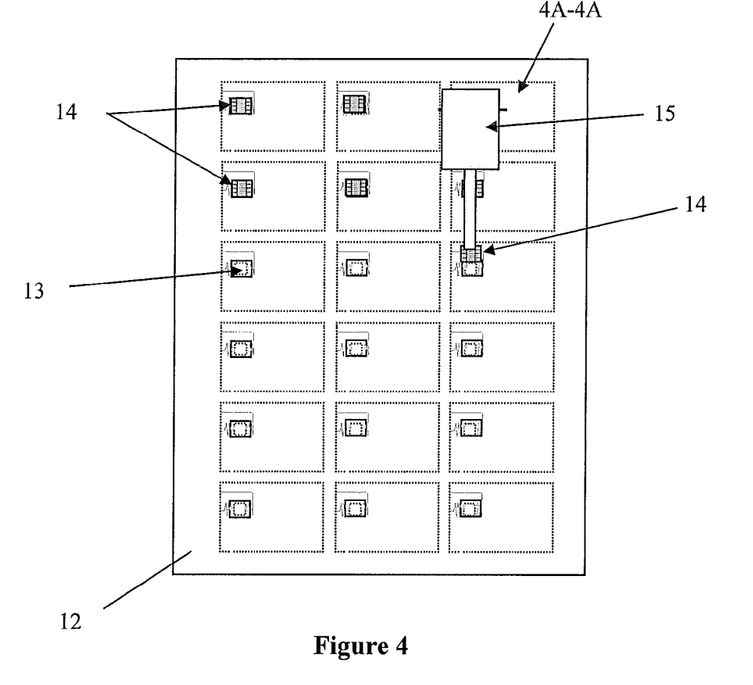
FIG. 4 shows a top view of a layer of material used to make cards according to embodiments of the invention in a fourth step.

In FIG. 4 a dual interface module 14 is transported and deposited in the cavity/recess 13 by transport and deposition means 15. Although only one transport and deposition means is represented in FIG. 4, it is to be understood that the method and device according to the present invention envisages preferably the use of several of such means, typically one for each cavity 13 present in the body 12 in order to execute this operation in parallel.

As mentioned above, the module is preferably a dual interface module allowing a contact type communication and a contact-less type communication.

Contact pads 16 of the chip module 14 are then brought into contact with conductive glue dots 10. An optimal and stable electrical contact of the antenna with the module is not fully realized at that moment as the glue is not yet cured.

Preferably, to help the module 14 to be fixed inside the cavity, a non-conductive adhesive 17 can be used. This adhesive can be thermally activated, for example by using a deposition means 15 with heating means in order to heat the module during its transport before its insertion in the recess 13.

Figure 4A:
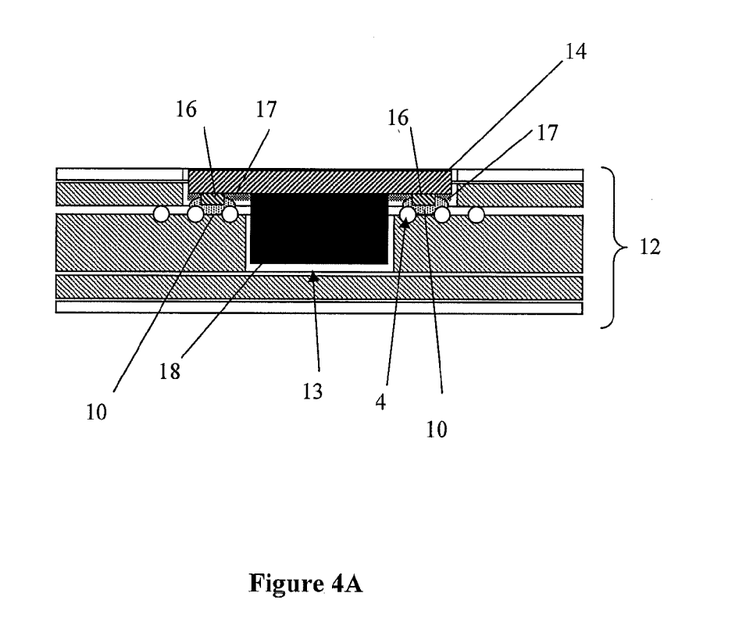
FIG. 4A shows a partial cross section across line 4A-4A of FIG. 4.

In FIG. 4A, a cross section of the module 14 being inserted in a recess 13 is illustrated (the transport and deposition means is not represented for the sake of clarity). This operation takes place for all the positions (illustrated by recesses 13 or chip module 14) represented in FIG. 4, and preferably in a simultaneous manner, although a sequential operation is also possible.

At the stage illustrated by FIG. 4A, i.e. before the final lamination step, all the elements are not yet definitively fixed together. There are multiple gaps separating each elements like between the different sheets of the body 12 piled one onto the other or between the side wall of the module (glob top 18 and lead frame) and the wall of the recess 13. Preferably, these gaps are kept as small as possible. In particular, the size of the punched hole should perfectly match the dimensions of the module. For the sake of clarity, the size of these gaps are exaggerated in FIG. 4A, where the separation between the different elements is clearly recognizable.

Figure 5:
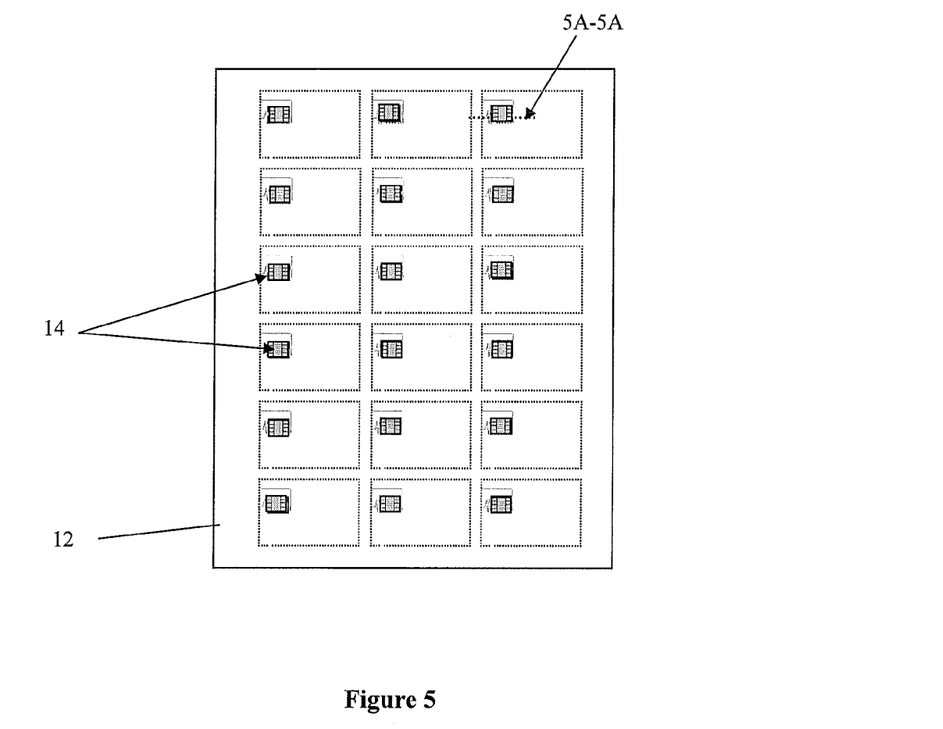
FIG. 5 shows a top view of a layer of material used to make cards according to embodiments of the invention in a fifth step.
Figure 5A:
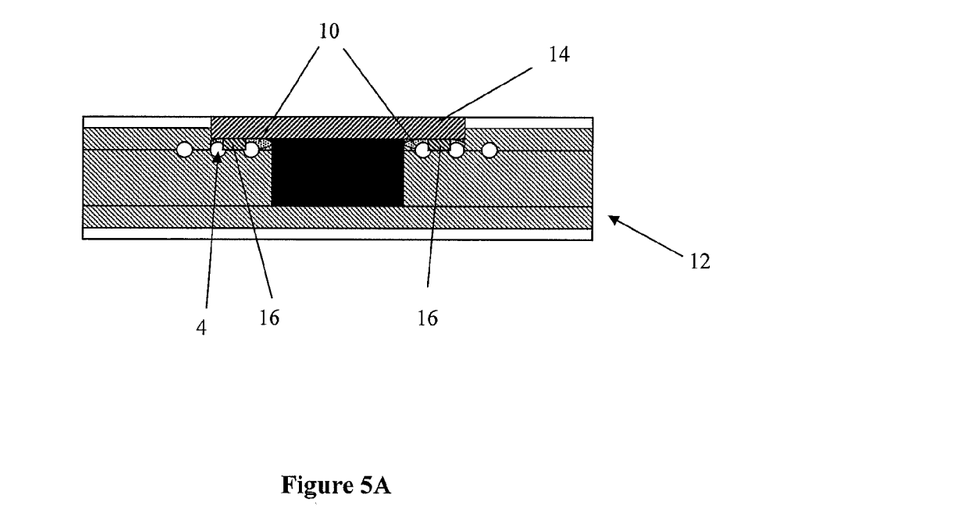
FIG. 5A shows a partial cross section across line 5A-5A of FIG. 5.

FIGS. 5 and 5A (partial cross section) show the result of the final lamination step that has been carried out.

The first effect of the lamination is to laminate all the sheets 1,5,6,8 and 9 forming the body 12 together, forming a unique card body having the final ISO card thickness and embedding the antenna and the module.

The main part of the module is embedded in the body 12 of the card. During the lamination, the plastic material of the card layers has been softened in order to fill the gaps around the glob top protection 18 of the module and the side of the lead frame of the module while under pressure, leaving only the upper surface of the module (the one having the contact electrodes for the contact-type communication) apparent and perfectly even with the surface of the card.

If the lamination parameters have been adequately chosen (for example 120° C. during 15 minutes and if Elecolit 3653 is used as glue), the glue 10 is fully polymerized and an adequate and stable electrical connection is established between the antenna pads 4 and the module pads 16.

Figure 6:
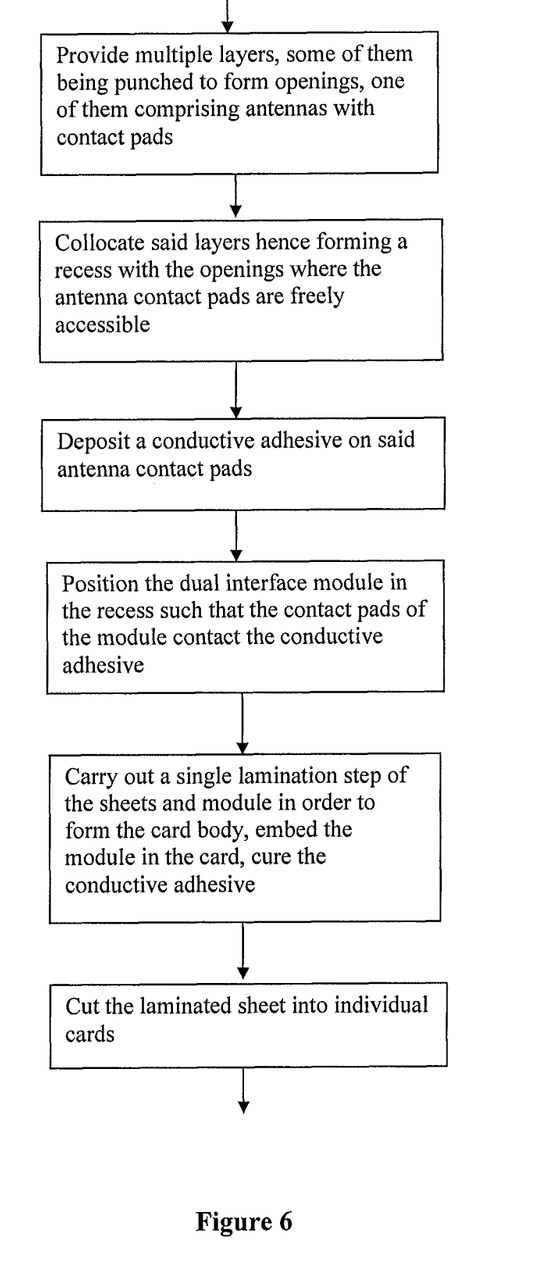
FIG. 6 shows a general block diagram of the method according to embodiments of the invention.

After this step, a card singulation using known methods in the smart card industry (for example punching) is carried out and the cards can be used as is usual in the art. FIG. 6 illustrates with block diagrams the process according to the present invention and it can be read in combination with the specification above.

The process according to embodiments of the invention has numerous advantages. It uses only one final lamination step once all the different layers and the chip module have been put together. This fact has the advantage that the chip module is effectively embedded in the structure of the card and there is no need for additional material (glue, insulation material etc) as disclosed in the art.

As indicated above, the process according to embodiments of the invention is preferably used with sheets of a size allowing the fabrication of several cards at the same time. Once the lamination step has been carried out, the individual cards can be cut out from the body 12 by punching or by another technique known in the art. Of course, it is also possible to use the method of the present invention for single cards.

The invention claimed is:

1. A method for manufacturing a dual interface card comprising a dual interface module showing free contact electrodes at the surface of the card for contact-type communication, and pads connected to an antenna embedded in the card body for contactless-type communication, the method comprising:
   collocating multiple card support sheets one onto the other, some of said support sheets showing holes to form a recess adapted to receive the dual interface module, one of said support sheets supporting the antenna having solid metallic contact pads at least partially freely accessible in the recess;
   depositing a conductive adhesive onto the contact pads;
   positioning the dual interface module in the recess such that the pads of the module are contacting the conductive adhesive; and
   executing a single lamination step of said support sheets with the module such that the multiple support sheets are laminated together into the card body, the dual interface module is embedded in the recess, and the conductive adhesive between the antenna and the dual interface module is cured thereby creating a permanent electrical contact between the dual interface module and antenna.

2. The method according to claim 1, wherein the antenna comprises an embedded wire.

3. The method according to claim 1, wherein the contact pads of the antenna comprise meanders formed with extremities of an embedded wire.

4. The method according to claim 1, wherein the antenna comprises a wire that is non insulated.

5. The method according to claim 1, wherein the antenna comprises a wire that is an insulated wire and wherein the insulation of the parts of the wire forming the contact pads has been at least partially removed.

6. The method according to claim 1, wherein the multiple support sheets are laminated together at a lamination temperature that is one of equal to and just above a curing temperature of the conductive adhesive.

7. The method according to claim 1, wherein lamination parameters used for the lamination step are similar to curing parameters used for the curing step of the conductive adhesive.

8. The method according to claim 1, further comprising:
   providing a non-conductive adhesive to help fix the module in the recess.

9. The method according to claim 8, wherein the non conductive adhesive is a thermosetting non conductive adhesive and wherein the method further comprises:
   heating the module before positioning the module in the recess.

10. The method according to claim 1, wherein said conductive adhesive comprises a thermosetting conductive adhesive.

11. A method for manufacturing a plurality of dual interface cards, each dual interface card comprising a dual interface module showing free contact electrodes at the surface of the card for contact-type communication, and pads connected to an antenna embedded in the card body for contactless-type communication, the method comprising:
   collocating multiple card support sheets one onto the other, some of said support sheets showing holes to form a recess adapted to receive the dual interface module, one of said support sheets supporting the antenna having solid metallic contact pads at least partially freely accessible in the recess;
   depositing a conductive adhesive onto the contact pads;
   positioning the dual interface module in the recess such that the pads of the module are contacting the conductive adhesive;
   producing a format comprising the plurality of cards by executing a single lamination step of said support sheets with the module such that the multiple support sheets are laminated together into the card body, the dual interface module is embedded in the recess, and the conductive adhesive between the antenna and the dual interface module is cured; and
   cutting each dual interface card out of the format after the lamination.

* * * * *